United States Patent [19]

Madajewski et al.

[11] 4,308,498
[45] Dec. 29, 1981

[54] KELVIN TEST FIXTURE FOR ELECTRICALLY CONTACTING MINIATURE, TWO TERMINAL, LEADLESS, ELECTRICAL COMPONENTS

[75] Inventors: John A. Madajewski, Nanticoke; Thomas S. Mickowski, Mountaintop, both of Pa.

[73] Assignee: RCA Corporation, New York, N.Y.

[21] Appl. No.: 59,113

[22] Filed: Jul. 19, 1979

[51] Int. Cl.³ ............... G01R 31/00; H01R 13/26
[52] U.S. Cl. .................. 324/158 F; 324/64; 339/258 F
[58] Field of Search ............ 324/158 F, 158 P, 64; 339/258 F

[56] References Cited

U.S. PATENT DOCUMENTS

| | | | |
|---|---|---|---|
| 3,340,473 | 9/1967 | Hertzler, Jr. | 324/158 F |
| 3,408,612 | 10/1968 | Bute et al. | 324/158 F |
| 3,971,618 | 7/1976 | Prince | 324/158 F |
| 4,075,556 | 2/1978 | Seaman | 324/60 C |

OTHER PUBLICATIONS

Hoffman et al.; "Printed Circuit Board . . . "; IBM Tech. Dis. Bull.; vol. 12; No. 4; Sep. 1969; pp. 552.

*Primary Examiner*—Ernest F. Karlsen
*Attorney, Agent, or Firm*—Birgit E. Morris; Donald S. Cohen; Robert P. Seitter

[57] ABSTRACT

A Kelvin test fixture for electrically contacting miniature, two terminal, leadless, electrical components assures the creation of good contact between the test fixture and the component to be tested by providing for the insertion of the component to be tested directly into the test fixture in a manner which creates a wiping action between the conductors of the test fixture and the terminals of the component to be tested. The test fixture attaches to appropriate parameter test equipment such as an RLC test bridge. The fixture has a small stable capacitance which may be deducted from the measured parameters by appropriate mathematical manipulations to yield the actual electrical parameters of the component under test.

9 Claims, 5 Drawing Figures

KELVIN TEST FIXTURE FOR ELECTRICALLY CONTACTING MINIATURE, TWO TERMINAL, LEADLESS, ELECTRICAL COMPONENTS

BACKGROUND OF THE INVENTION

1. Field of the Invention

The invention relates to the field of test fixtures for electrically contacting electrical components in order to measure the electrical parameters of the components.

2. Prior Art

The prior art is replete with component parameter test equipment designed for testing electrical components such as resistors, capacitors, inductors and so forth. These component testers include, or will accommodate, many types of contact fixtures designed for holding the flexible leads of leaded components. Some of these component holders feature automatic component insertion and removal while others are designed for rapid insertion and removal of the components by the operator.

Some of this test equipment employs Kelvin testing. In Kelvin testing, each lead of the component to be tested makes contact with two contacts of the test bridge. The test bridge provides a drive signal to the component under test through a first one of these contacts. A sensing signal is provided to the bridge through the second of these contacts. The sensing contacts of the bridge are connected to high impedance circuits within the bridge so that they draw very little current thereby minimizing the effect of any contact resistance on the signal transmitted from the component to the test circuitry of the bridge. Contact resistance between the drive signal contacts of the bridge and the leads of the component under test produce a minimal effect on the parameter values measured by the bridge because the contact resistance and inductance of these contacts is not included within the test loop of the bridge.

Despite the high degree of sophistication of test equipment for leaded components, the testing of miniature, leadless components has been a haphazard, jury-rigged affair. Among the known techniques for the testing of miniature leadless components is the use of alligator clips for contacting the individual terminals of the device to be tested. Such a procedure is tedious, time consuming and of questionable accuracy, especially when components as small as 1/16 of an inch (~1.59 millimeters) long by 1/32 of an inch (~0.79 millimeter) square are to be tested. It is extremely difficult to make good temporary contact to such small components for performing incoming inspection tests to assure that they meet their specifications.

U.S. Pat. Nos. 3,971,618 and 4,075,556 each disclose a test fixture designed for testing miniature leadless components. These systems fail to assure the creation of reliable contact between the test fixture and the component to be tested and thus fail to assure that inaccuracies will not be introduced into the measurements.

Inaccurate testing of such miniature components is a substantial problem because these components are often incorporated in high reliability circuits such as hybrid heart pacemaker units, ground falt interruptor circuits and other similar systems where system failure can cause the immediate death of the wearer or severe injury or death to the user of the system.

An improved system for testing these miniature components is needed in order that measurement accuracy may be assured with a consequent increase in the yield of assembled systems and an increase in the reliability of such systems.

SUMMARY OF THE INVENTION

The problems of the prior art in respect to the testing of miniature, two terminal, leadless, electrical components are overcome by a Kelvin test fixture which assures the creation of a good contact between the component to be tested and the test fixture conductors which are in turn connected to a test bridge. The test fixture includes the component under test in a first circuit including a first input conductor and a first output conductor. The test fixture also includes the component under test in a second circuit including a second input conductor and a second output conductor. Power connections to the device under test are provided either by the first set of conductors or the second set of conductors. The sensing circuit connections to the component under test are provided by the other set of conductors. The component under test is inserted between the first set of conductors and the second set of conductors for testing. Good contact between the component under test and the conductors of the test fixture is assured by placing the component to be tested on the fixture and then pushing it into a testing position in a manner which produces a wiping action between each component terminal and the test fixture conductors it contacts. This good contact during testing assures that the measured component values will reflect the actual electrical parameters of the component being tested.

PREFERRED EMBODIMENT OF THE INVENTION

Figure 1:
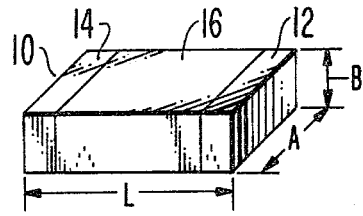
FIG. 1 illustrates one example of the type of electrical component which this test fixture is designed to contact.
Figure 2:
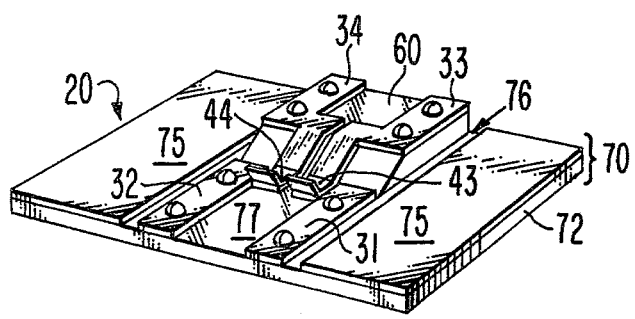
FIG. 2 is a perspective view of the preferred test fixture.
Figure 3:
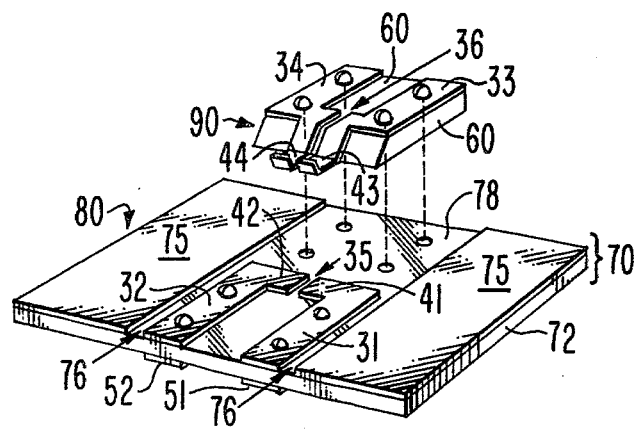
FIG. 3 is an exploded perspective view of the preferred embodiment.

The configuration of a typical, miniature, two terminal, leadless, electrical component 10 to be tested us illustrated in FIG. 1. The component 10 has a first terminal 12, a second terminal 14 and a main body 16 which spaces the terminals 12 and 14 apart. The component dimensions A and B may vary from minimums of about 1.32 of an inch (~0.79 millimeter) to about ⅛ of an inch (~3.18 millimeter). The component dimension L may vary from about 1.16 of an inch (~1.59 millimeters) to about ½ inch (12.7 millimeters).

The preferred embodiment of a test fixture 20 for making electrical contact to these miniature, two terminal, leadless, electrical components is illustrated in FIGS. 2-5. The test fixture 20 is preferably fabricated from a printed circuit board 70 having a substantially rigid electrically insulating substrate 72. The printed circuit board 70, as illustrated in the lower portion of FIG. 3, constitutes the sensing portion 80 of a Kelvin test system. The portion of the test fixture illustrated in the upper portion of FIG. 3 constitutes a drive signal portion 90 of a Kelvin test system. The roles of portions 80 and 90 of the structure may be reversed, in accordance with the operator's desires and the manner in which the test fixture 20 is attached to the parameter test system with which it is used.

The conductive layer on the upper surface of the printed circuit board 70 has been defined into four separate segments. Segment 31 constitutes a sensing conductor for contacting a first terminal (such as 12) of the component to be tested and has a component contact portion 41 for that purpose. Segment 32 constitutes a sensing conductor for contacting the second terminal (such as 14) of the component to be tested and has a component contact portion 42 for that purpose. A gap 35 separates conductor 31 from conductor 32 and serves to isolate the conductors from each other except when a device is inserted for testing. The conductor segments 75 constitute ground planes which minimize interference from outside sources. If desired, the segments 75 may be omitted. The two elongated conductorless regions 76 on the upper surface of the insulating substrate 72 serve to isolate the ground planes 75 from the conductors 31 and 32. The conductorless portion 77 of the upper surface of the substrate 72 aids in minimizng the capacitance between conductors 31 and 32 by spacing the main bodies of these conductors from each other.

Two drive signal supply conductors 33 and 34 have their main bodies resting on the top of an insulating spacer block 60. Conductor 33 constitutes a power conductor for contacting the first terminal of the component to be tested and has a component contact portion 43 for that purpose. Conductor 34 constitutes a power contact for contacting the second terminal of the component to be tested and has a component contact portion 44 for that purpose. Conductors 33 and 34 are isolated from each other by a gap 36 therebetween. The component contact portions 43 and 44 of these conductors project beyond the edge of the spacer block 60 in a manner which, after assembly of the fixture, causes the component contact portion 43 of conductor 33 to contact the component contact portion 41 of conductor 31 when no component is in the test fixture. Similarly, the component contact portion 44 of conductor 34 contacts the component contact portion 42 of conductor 32 when no component is in the test fixture.

The conductorless segment 78 of the upper surface of the substrate 72 under spacer block 60 aids in minimizing the capacitance of the test fixture by minimizing the direct coupling between the sensing conductors 31 and 32 and the drive conductors 33 and 34. This capacitance minimization is aided by spacer block 60 which also aids in assuring good contact between the conductors of the test fixture and the terminals of the device to be tested.

Figure 4:
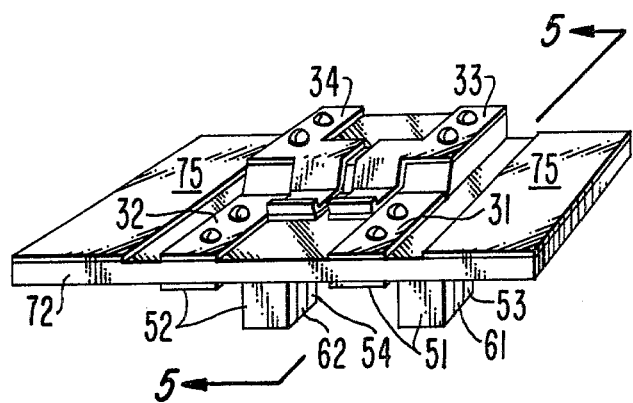
FIG. 4 is a perspective view of the preferred embodiment from a different angle.
Figure 5:
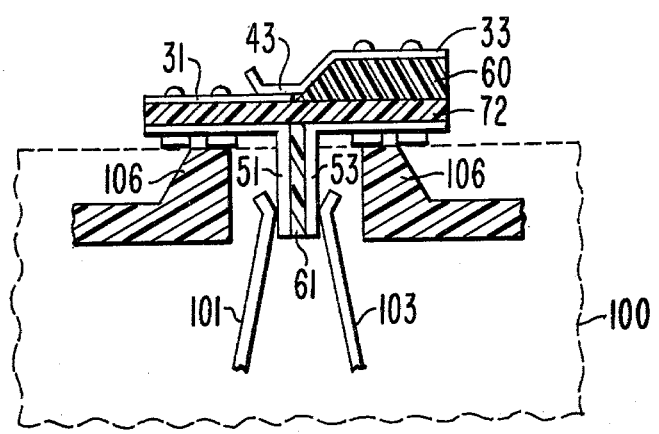
FIG. 5 is a cross section taken along line 5—5 in FIG. 4.

As is illustrated in FIGS. 4 and 5, fixture 20 includes four substantially rigid leads 51–54 for connecting the test fixture to a test bridge. Each of these leads 51–54 is electrically continuous with one of the conductors 31–34. Thus, lead 51 is electrically continuous with conductor 31, lead 52 is electrically continuous with conductor 32, lead 53 is electrically continuous with conductor 33 and lead 54 is electrically continuous with conductor 34.

Mechanical fasteners such as nuts and bolts are preferably used to secure the leads 51–54 to the rest of the fixture and to electrically connect them to the conductors 31–34, respectively. It is preferred to assemble the fixture without using solder in order to avoid the potential for changes in the electrical characteristics of the fixture in the event of solder failure or separation.

As is most clearly shown in FIG. 5, the leads 51 and 53 are in alignment with each other and are insulated from each other by an intervening insulating layer 61. The leads 51 and 53 and insulator 61 are configured and adapted for insertion into a component test bridge as though they were one lead of a two leaded component. Similarly, the structure comprising leads 52 and 54 and an insulator 62 therebetween is adapted for insertion into the test bridge as though it were the other lead of a two leaded component under test.

A portion of a test bridge 100 is illustrated in FIG. 5 in order that the connection of the test fixture 20 to the bridge may be clear. As illustrated, the lower side of the test fixture 20 rests on insulating protrusions 106 of the test bridge socket. Lead 51 contacts a first Kelvin contact 101 of the bridge while the lead 53 contacts a second Kelvin contact 103 of the bridge. A similar contact arrangement exists for leads 52 and 54 of the test fixture. The details of the configuration of the leads 51–54 as illustrated in the figures are designed for insertion into a General Radio 1658 RLC digibridge. Other configurations of the leads 51–54 may be utilized when appropriate for use with other test bridges.

There are several reasons that the fixture is designed to have the component contact portions of conductors 31 and 33 in contact with each other when no component to be tested is in the fixture. The same reasons apply to the contact between the component contact portions of conductors 32 and 34 when no component is in the test fixture.

First, this contact between the conductors completes the test and drive circuits in a manner which allows the test bridge to accurately measure the electrical parameters of the test fixture itself. In accordance with the characteristics of the test bridge, these parameter values may either be recorded within the bridge or on paper for use in computing the actual electrical parameters of a component under test from the parameters read by the bridge when testing the component. Mathematical manipulations for performing this function are well known to those of ordinary skill in the art. Alternatively, if the bridge is equipped to do so, the parameters of the test fixture may be zeroed out within the bridge and the test fixture thus treated as though it were part of the bridge internal circuitry rather than an external component. Zeroing out of the test fixture parameters eliminates the need to calculate the actual parameter values of a component under test since the bridge will directly display the electrical parameters of the component under test.

A second reason for the contact between the component contact portions of the conducters 31 and 33 and 32 and 34 is that when a component is placed on the test fixture in front of the component contact portions of the conductors and then pushed under the conductors 33 and 34 a wiping action is produced which cleans each of the contact areas. This wiping action is produced independent of the thickness of the component to be tested since the component contact portions of the conductors are initially in contact and will be wiped by the terminals of the component to be tested no matter how thin that component is. Without such wiping action, problems can arise in measuring the component parameters because of films of dirt or compounds such as oxides on the component terminals or the test fixture conductors. Presence of these materials can cause readings which do not properly reflect the actual electrical parameters of the component under test. If the wiping action were absent, components which were within specifications might be rejected as being outside of specifications and components which were outside of specifications might be accepted as being within specifications. The latter is a potentially serious problem because it can lead to failure of the ultimate product into which the components are assembled.

As can be seen most clearly from FIG. 5, the component contacting portions 43 and 44 of conductors 33 and 34, respectively, have their ends bent upward in a manner to simplify the insertion of a component to be tested between the component contact portions 43 and 44 of conductors 33 and 34 and the component contact portions 41 and 42 of conductors 31 and 32.

The overall dimensions of our preferred test fixture are 5½ inches (13.97 cm) long by 2 inches (5.08 cm) deep by about ¾ inches (~1.91 cm) high. The leads 51–54 preferably extend ½ inch (1.27 cm) below the lower surface of the circuit board 70. The gaps 35 and 36 between the test fixture conductors 31 and 32 and 33 and 34, respectively, must be sufficient to prevent arcing between these conductors at test voltages and are preferably 0.015 inch (0.381 millimeter) wide. The gaps 35 and 36 are preferably accurately aligned one above the other in order that components only 1/16 of an inch (~1.59 millimeter) long may be relatively easily inserted in a manner which causes proper, non-shorting, contact between the terminals of the device and the conductors of the test fixture.

The spacer block 60 is preferably comprised of Delrin having a height of about ⅛ inch (3.18 millimeters). The conductors 31 and 32 are preferably 5 mils (0.127 millimeter) thick copper while the conductors 33 and 34 are preferably 10 mils (0.254 millimeter) thick copper. The contact portions 41 and 42 are preferably ¼ inch (6.36 millimeters) wide, as are the contact portions 43 and 44. The leads 51–54 are copper strips 0.015 inch (0.381 millimeter) thick by ¼ inch (6.36 millimeters) wide. The insulation between the leads 51 and 53 and 52 and 54 is 0.006 inch (0.152 millimeter) thick mica cemented to the leads. The test fixture in accordance with these specifications has a capacitance of less than 3 pfds and a resistance in series with the component to be tested of less than 0.001 ohm and essentially 0 inductance (less than 0.001 MH at 1 KHZ). This small capacitance can be ignored when capacitors larger than 300 pfd are being tested.

This test fixture is simple to fabricate, suitable for one-handed insertion of components and provides a short path for current from the bridge terminals to the terminals of the component under test.

In this fixture, after repeated use to test relatively thick (~⅛ inch or ~3.18 millimeter thick) components, the contact portions of the upper conductors no longer touch the contact portions of the lower conductors when no component is present. This has no substantial adverse effect so long as the wiping action remains effective. The electrical parameters of the test fixture can be determined by using an insulator to push the upper contact areas into contact with the lower contact areas or by inserting separate small conductors between the aligned contact areas to cause the fixture to appear electrically as though the upper contact areas directly contacted the lower contact areas. Thus, although actual contact between the upper and lower contact areas in the absence of the component is considered preferable, it is not essential.

A test fixture in accordance with this invention enables accurate, repeatable, rapid measurement of the electrical parameters of miniature, two terminal, leadless, electrical components. It provides a major advance over prior art techniques, both as to ease of use and as to the accuracy of the measurements obtained. Those skilled in the art will be able to vary the construction and arrangements of test fixtures in accordance with this invention without departing from the scope of the invention as defined in the appended claims.

What is claimed is:

1. A Kelvin test fixture for electrically contacting two terminal, leadless, miniature, electrical components for measurement of their electrical parameters, said test fixture comprising:

a substantially rigid insulating member having first and second opposed major surfaces;

first and second conductor means each having a component contact portion rigidly mounted on said first major surface, said first and second conductor means being electrically insulated from each other and being spaced apart from each other;

insulating spacer means mounted on said first major surface adjacent said component contact portions of said first and second conductor means, said spacer means having a support surface spaced from said first major surface;

third and fourth conductor means rigidly mounted on said support surface, said third and fourth conductor means being electrically insulated from each other and being spaced apart from each other, each of said third and fourth conductor means extending beyond said support surface at an angle thereto and terminating in a component contact portion overlying said component contact portions of said first and second conductor means, said third and fourth conductor means being flexible so that upon insertion of an electrical component between said component contact portions said component spreads said component contact portions apart.

2. The fixture recited in claim 1 wherein said fixture is adapted to test miniature, two terminal, leadless electrical components which are not more than about ½ inch long and not more than about ⅛ inch thick.

3. The fixture recited in claim 1 wherein:
said first and said second conductor means comprise printed wiring.

4. The test fixture recited in claim 1 wherein:
said rigid member comprises a printed circuit board; and
said first and second conductor means comprise printed wiring on said printed circuit board.

5. The fixture recited in claim 1 wherein said fixture further comprises first, second, third and fourth lead means insulated from each other and positioned for insertion into contact openings of a device parameter test system;
said first conductor means electrically connected to said first lead means;
said second conductor means electrically connected to said second lead means;
said third conductor means electrically connected to said third lead means; and
said fourth conductor means electrically connected to said fourth lead means.

6. The test fixture recited in claim 1 wherein:

said rigid member extends beyond the area covered by said first, second, third and fourth conductor means and said spacer means; and said fixture further comprises ground plane means disposed on portions of said rigid member.

7. The fixture recited in claim 1 further comprising: means for electrically connecting said first, second, third and fourth conductor means to a device parameter test system.

8. The fixture recited in claim 1 wherein the free ends of said component contact portions of said third and fourth conductor means are bent at an angle away from said component contact portions of said first and second conductor means.

9. The fixture recited in claim 1 wherein said component contact portions of said third and fourth conductor means contact said component contact portions of said first and second contact means.

* * * * *